United States Patent
Hall et al.

(10) Patent No.: US 8,524,557 B1
(45) Date of Patent: Sep. 3, 2013

(54) INTEGRATION TECHNIQUE USING THERMAL OXIDE SELECT GATE DIELECTRIC FOR SELECT GATE AND REPLACEMENT GATE FOR LOGIC

(71) Applicants: Mark D. Hall, Austin, TX (US); Mehul D. Shroff, Austin, TX (US); Frank K. Baker, Jr., Austin, TX (US)

(72) Inventors: Mark D. Hall, Austin, TX (US); Mehul D. Shroff, Austin, TX (US); Frank K. Baker, Jr., Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/789,971

(22) Filed: Mar. 8, 2013

Related U.S. Application Data

(63) Continuation of application No. 13/402,426, filed on Feb. 22, 2012.

(51) Int. Cl.
*H01L 21/8246* (2006.01)

(52) U.S. Cl.
USPC .................. 438/268; 257/E21.662; 438/237

(58) Field of Classification Search
USPC .......... 438/237, 238, 257–268; 257/E21.662
See application file for complete search history.

(56) References Cited

U.S. PATENT DOCUMENTS

| | | | |
|---|---|---|---|
| 6,777,761 B2 | 8/2004 | Clevenger et al. | |
| 7,208,793 B2 * | 4/2007 | Bhattacharyya | 257/314 |
| 7,544,990 B2 * | 6/2009 | Bhattacharyya | 257/315 |
| 7,795,091 B2 | 9/2010 | Winstead et al. | |
| 8,334,198 B2 | 12/2012 | Chen et al. | |

OTHER PUBLICATIONS

U.S. Appl. No. 13/442,142, Office Action—Ex Parte Quayle—mailed Apr. 4, 2013.
U.S. Appl. No. 13/402,426, Office Action—Notice of Allowance—mailed May 3, 2013.

* cited by examiner

*Primary Examiner* — Savitr Mulpuri
(74) *Attorney, Agent, or Firm* — James L. Clingan, Jr.; Joanna G. Chiu

(57) ABSTRACT

A control gate overlying a charge storage layer is formed. A thermally-grown oxygen-containing layer is formed over the control gate. A polysilicon layer is formed over the oxygen-containing layer and planarized. A first masking layer is formed defining a select gate location laterally adjacent the control gate and a second masking layer is formed defining a logic gate location. Exposed portions of the polysilicon layer are removed such that a select gate remains at the select gate location and a polysilicon portion remains at the logic gate location. A dielectric layer is formed around the select and control gates and polysilicon portion. The polysilicon portion is removed to result in an opening in the dielectric. A high-k gate dielectric and logic gate are formed in the opening.

20 Claims, 8 Drawing Sheets

INTEGRATION TECHNIQUE USING THERMAL OXIDE SELECT GATE DIELECTRIC FOR SELECT GATE AND REPLACEMENT GATE FOR LOGIC

CROSS-REFERENCE TO RELATED APPLICATIONS

This application is related to U.S. patent application Ser. No. 13/790,004, titled "INTEGRATION TECHNIQUE USING THERMAL OXIDE SELECT GATE DIELECTRIC FOR SELECT GATE AND PARTIAL REPLACEMENT GATE FOR LOGIC," naming Mark D. Hall, Mehul D. Shroff, and Frank K. Baker as inventors, assigned to the current assignee hereof, and filed on even date herewith.

This application is continuation-in-part of U.S. patent application Ser. No. 13/402,426, filed on Feb. 22, 2012, titled "NON-VOLATILE MEMORY CELL AND LOGIC TRANSISTOR INTEGRATION," naming Mehul D. Shroff and Mark D. Hall as inventors, and assigned to the current assignee hereof, and which is hereby incorporated by reference.

BACKGROUND

1. Field

This disclosure relates generally to non-volatile memories, and more specifically, to integrating non-volatile memories with logic transistors on the same integrated circuit.

2. Related Art

Many semiconductor devices include, or embed, non-volatile memory (NVM) transistors with other transistor types on the same integrated circuit (IC). The manufacturing processes for the different transistor types may not be the same, requiring that the processes be integrated. For example, to integrate NVM with CMOS (complementary metal oxide semiconductor), the CMOS process may be modified to include the process steps necessary to fabricate the NVM memory cell and the supporting devices.

Flash NVM is commonly embedded in, for example, system-on-a-chip (SoC) integrated circuits having CMOS logic circuitry. The flash NVM may include a floating gate comprising polysilicon, or use a charge storage layer comprising nanocrystals or an ONO (oxide-nitride-oxide) layer. The memory cell may also include a control gate comprising polysilicon, a metal, or both. In addition, it may be desirable to use a high-k (where k refers to the dielectric constant of the material) gate dielectric in the logic transistor. Integrating the non-volatile memory cell with the logic transistor having the metal gate and the high-k gate dielectric on the same integrated circuit may require many additional process steps.

What is needed is a process integration methodology to efficiently embed a NVM cell array with metal gate/high-k dielectric logic transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a non-volatile memory (NVM) cell and a logic transistor efficiently integrates NVM and logic on a single integrated circuit. This integration utilizes thermal oxide for the gate dielectric of the select gate and replacement gate to obtain metal gates for the logic. This is better understood by reference to the drawings and the following description.

The semiconductor substrate described herein can be any semiconductor substrate having a thermally oxidizable top surface.

Figure 1:
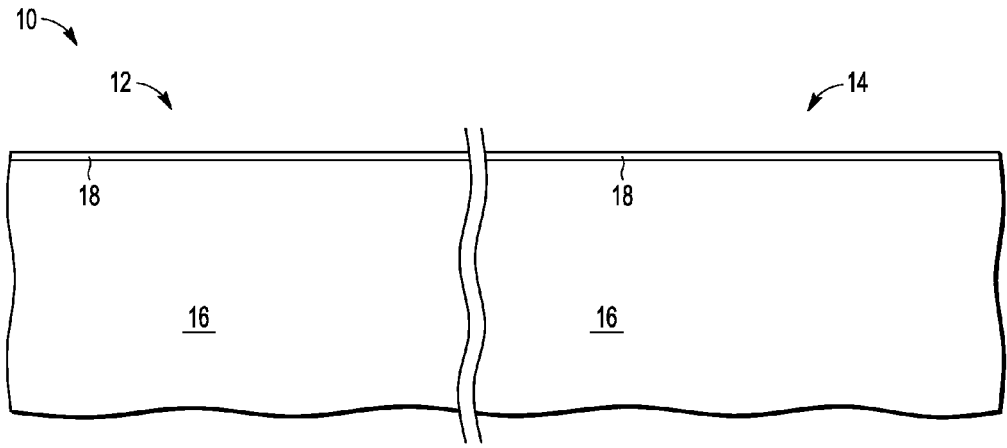
FIG. 1 is a cross section of a semiconductor device at a stage in processing according to an embodiment.

Shown in FIG. 1 is a semiconductor device 10 having a semiconductor substrate 16, an NVM region 12 in and over a portion of substrate 16, a logic region 14 in and over a portion of substrate 16, and a hard mask layer 18 over substrate 16. In and over the same substrate 16, there may be other regions as well. A process for forming a single logic transistor and a single NVM cell will be shown in subsequent figures and are exemplary of other transistors and memory cells to be formed in those regions. Hard mask layer 18 may be nitride and may be about 100 Angstroms thick. Other materials and thicknesses may also be used.

Figure 2:
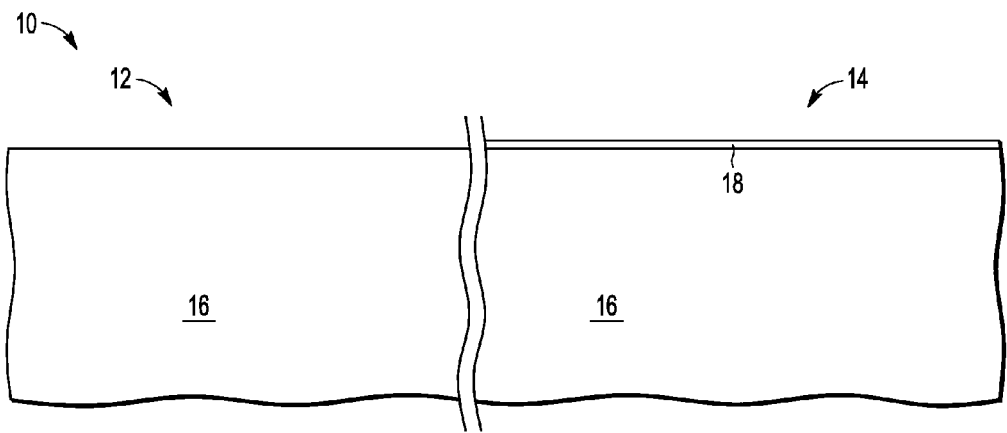
FIG. 2 is a cross section of the semiconductor device of FIG. 1 at a subsequent stage in processing.

Shown in FIG. 2 is semiconductor device 10 after removing hard mask layer 18 from NVM region 12. A mask, not shown, is used for this etch.

Figure 3:
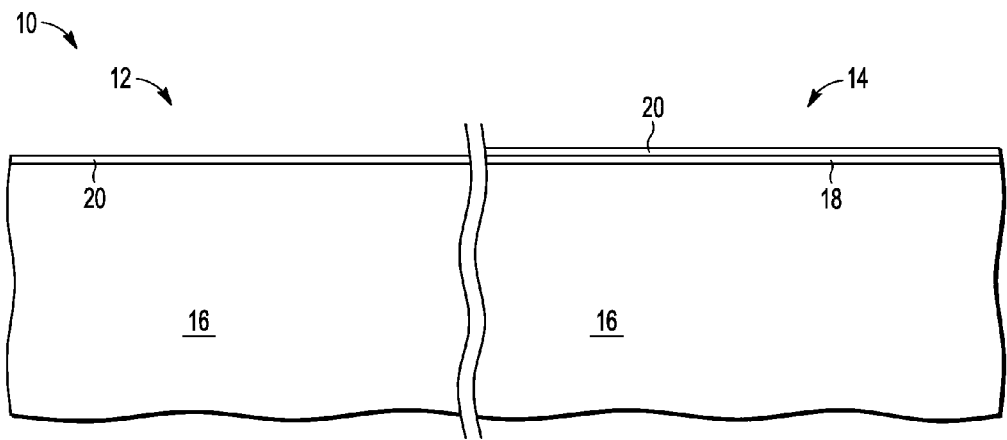
FIG. 3 is a cross section of the semiconductor device of FIG. 2 at a subsequent stage in processing.

Shown in FIG. 3 is semiconductor device 10 after depositing a charge storage layer 20 over NVM region 12 on substrate 16 and over logic region 14 on hard mask layer 18.

Figure 4:
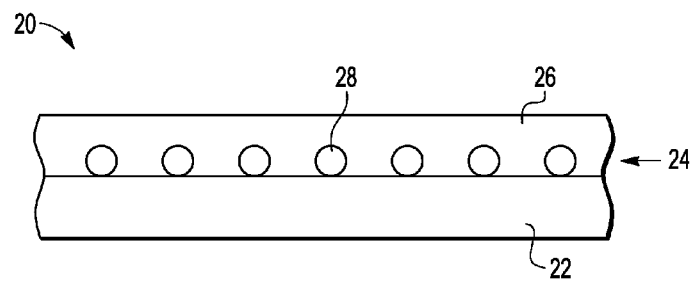
FIG. 4 is a portion of the semiconductor device shown in FIG. 3 in more detail.

Shown in FIG. 4 is charge storage layer 20 in more detail. Charge storage layer has a dielectric layer 22 on substrate 16, a plurality of nanocrystals 24 on dielectric layer 22 including an exemplary nanocrystal 28, and a dielectric layer 26 on dielectric layer 22 and on and around nanocrystals 24. Dielectric layers 22 and 26 are preferably oxide. Dielectric layer 22 is the dielectric layer through which charge flows to nanocrystals 24 for program as well as the gate dielectric between nanocrystals 24 and a channel. Dielectric layer 26 is the dielectric layer through which charge flows from nanocrystals 24 for erase. Nanocrystals are preferably silicon in order to be able to withstand a subsequent thermal oxidation step.

Figure 5:
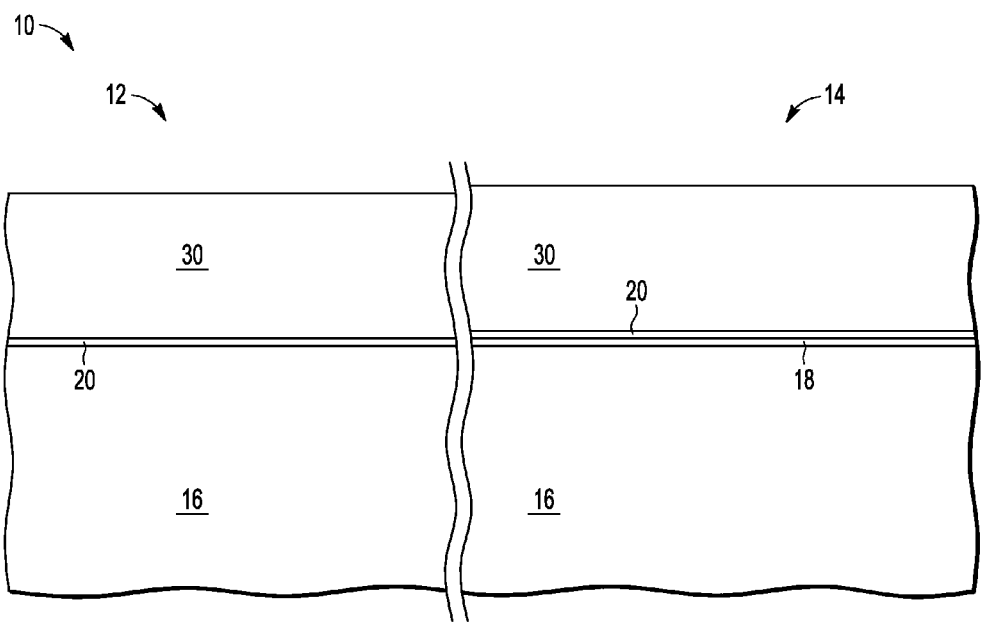
FIG. 5 is a cross section of the semiconductor device of FIG. 3 at a subsequent stage in processing.

Shown in FIG. 5 is a semiconductor device after forming a gate material 30 on charge storage layer 20 in NVM region 12 and logic region 14. Gate material 30 may have a thickness of about 800-1000 Angstroms. Gate material 30 may be metal which may provide a benefit over polysilicon. Polysilicon may be used as well. Gate material 30 may also be a stack of conductive materials that may include metal and polysilicon.

Figure 6:
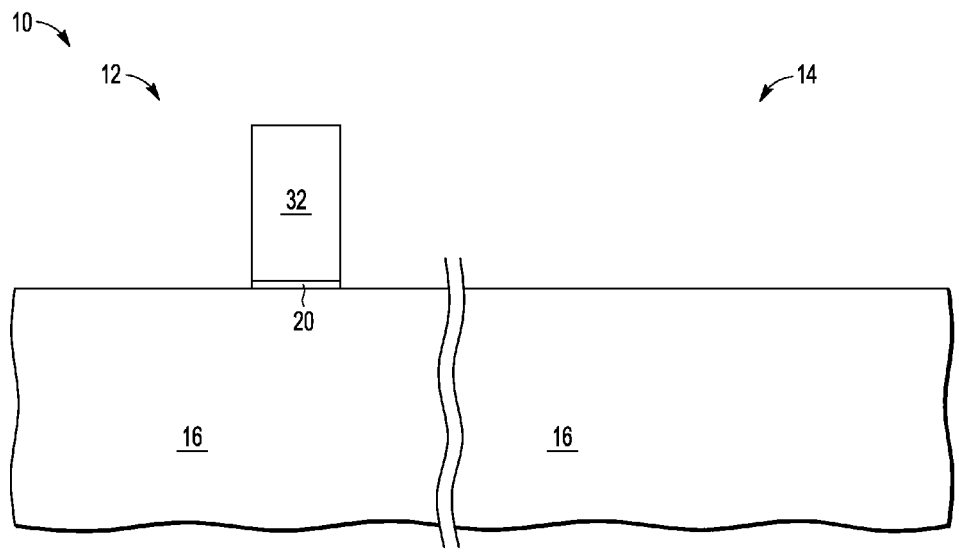
FIG. 6 is a cross section of the semiconductor device of FIG. 5 at a subsequent stage in processing.

Shown in FIG. 6 is semiconductor device 10 after etching gate material 30 and charge storage layer 20. There need not be any change to gate material 30 other than patterning it, but the result is what will be used as a functional structure, control gate 32, in NVM region 12. Gate material 30, charge storage layer 20, and hard mask layer 18 are removed from logic region 14 so that a top surface of substrate 16 will be exposed in logic region 14. The top portion of substrate 16 is also exposed in NVM region 12 except where control gate 32 is present.

Figure 7:
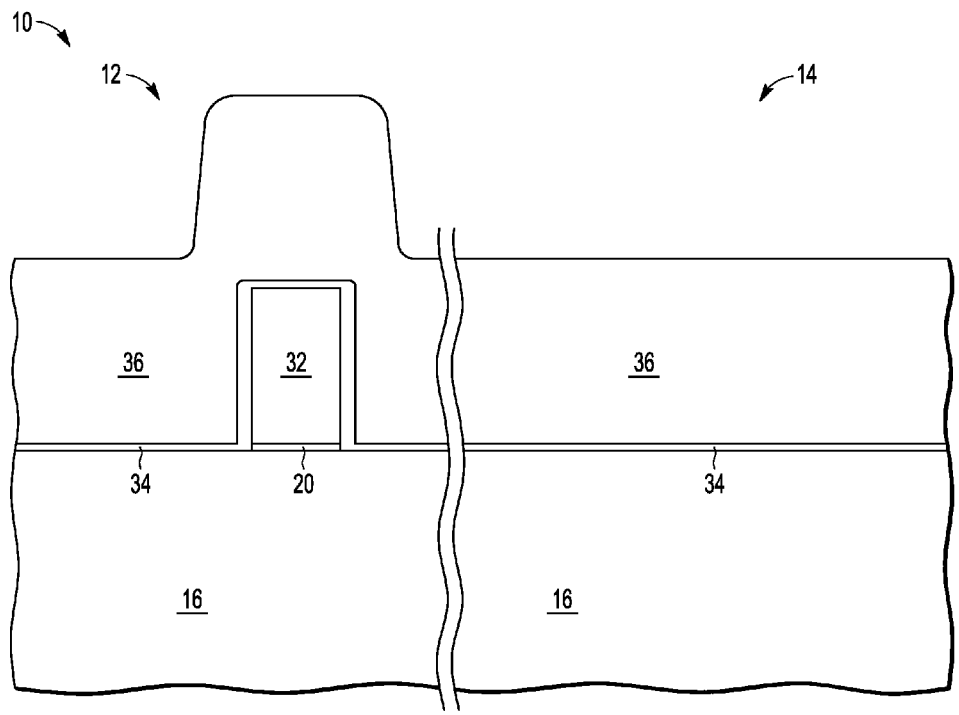
FIG. 7 is a cross section of the semiconductor device of FIG. 6 at a subsequent stage in processing.

Shown in FIG. 7 is semiconductor device 10 after forming a dielectric layer 34 on the exposed portions of NVM region 12 and logic region 14 and on control gate 32. Dielectric layer 34 on substrate 16 is thermally grown and may be referenced as a thermal oxide layer or simply an oxide layer. Oxide layer 34 on control gate 32 may be formed by first depositing a conformal oxide layer followed by an anisotropic etch which forms a sidewall spacer around control gate 32 and removes the oxide layer from substrate 16. Oxide layer 34 is then grown on substrate 16. This growing of oxide layer 34 is at a relatively high temperature, greater than a temperature which would cause damage to what would be previously formed layers such as metal layers. The result is oxide layer 34 is high quality and effective as a gate dielectric for a select gate. Oxide layer 34 may be thicker on control gate 32 where it may be both deposited and grown than it is on substrate 16 where it is only grown. A layer 36 of polysilicon is formed on oxide layer 34 in NVM region 12 and logic region 14. The lower portion of layer 36 is preferably slightly thicker than the stack formed by dielectric layer 34 and control gate 32. Layer 36 will be used as a dummy gate in logic region 14 and as a select gate in NVM region 12.

Figure 8:
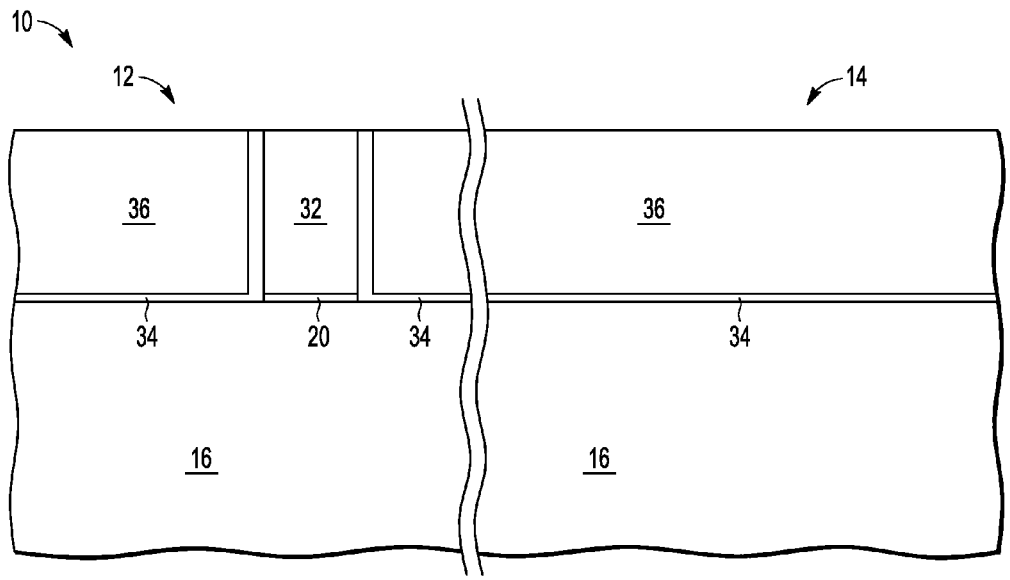
FIG. 8 is a cross section of the semiconductor device of FIG. 7 at a subsequent stage in processing.

Shown in FIG. 8 is semiconductor device 10 after performing a planarization process such as chemical mechanical polishing (CMP) on layer 36 to leave layer 36 in a planar form having a height about the same as control gate 32. The CMP process may be preceded by first depositing a sacrificial layer to support the protrusions and thereby reduce the likelihood of failures where the protrusions are.

Figure 9:
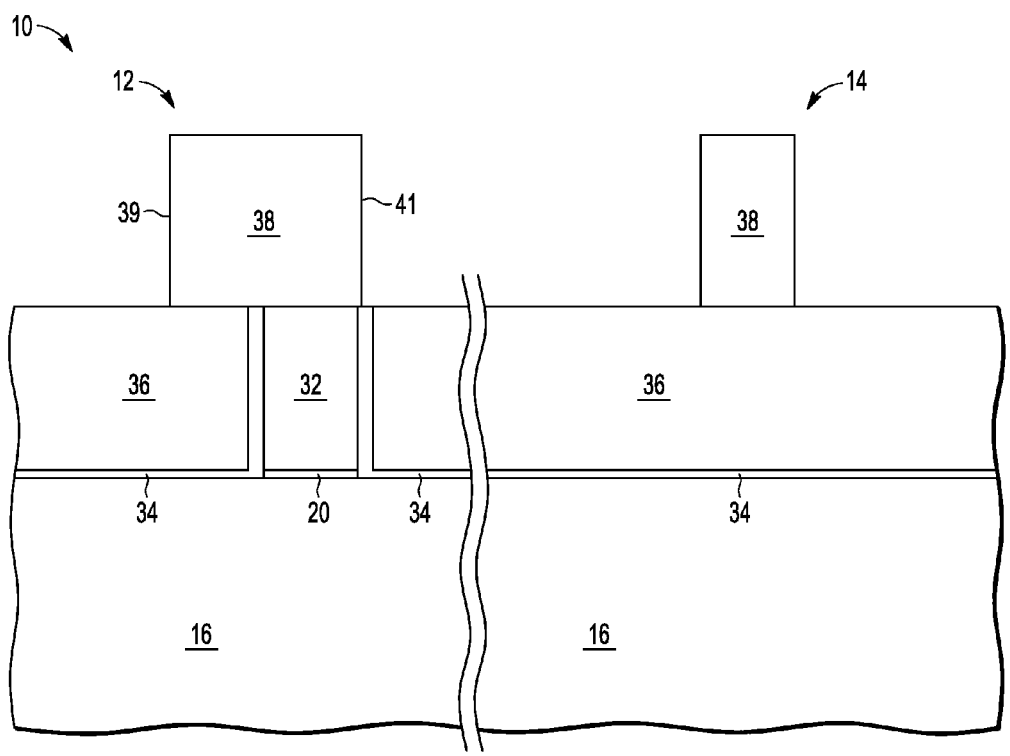
FIG. 9 is a cross section of the semiconductor device of FIG. 8 at a subsequent stage in processing.

Shown in FIG. 9 is semiconductor device 10 after forming patterned photoresist 38 which has a first portion in NVM region 12 over control gate 32 that has a first sidewall 39 extending away from a first sidewall 33 of control gate 32 for defining the select gate. The first portion of patterned photoresist 38 in NVM region 12 has a second sidewall 41 substantially aligned to oxide layer 34 where oxide layer 34 is along a second sidewall 35 of control gate 32. Second sidewall 35 of control gate 32 is opposite first sidewall 33 of control gate 32. The horizontal thickness of oxide layer 34 along the sidewalls of control gate 32 is preferably at least twice the alignment tolerance for the second sidewall 41 of photoresist 38 in NVM region 12 so that second sidewall 41 of photoresist 38 in NVM region 12 is neither over control gate 32 nor over polysilicon layer 36 but only over oxide layer 34 along the second sidewall 35 of control gate 32. Patterned photoresist 38 has a second portion in logic region 14 that will be used to define a gate of a logic transistor.

Figure 10:
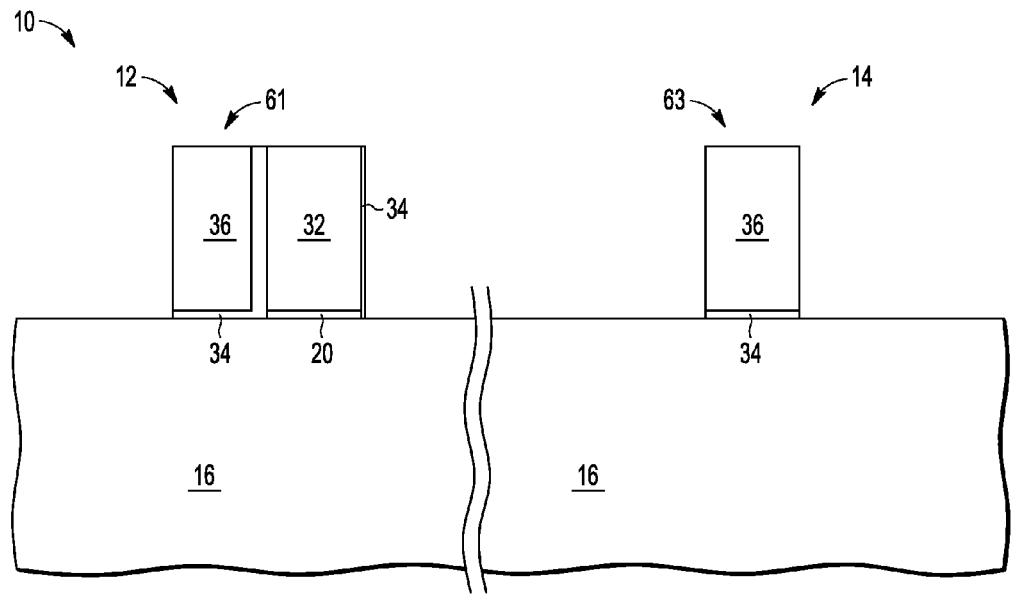
FIG. 10 is a cross section of the semiconductor device of FIG. 9 at a subsequent stage in processing.

Shown in FIG. 10 is semiconductor device 10 after performing an etch using patterned photoresist 38 as a mask leaving a first portion of polysilicon layer 36, which is the select gate and may be referenced as select gate 61, adjacent to control gate 32 in NVM region 12 and a second portion of polysilicon layer 36, which may be referenced as dummy gate 63, in logic region 14. Also removed is oxide layer 34 that was not under patterned photoresist 38. Dummy gate 63 will be replaced by a metal during subsequent processing. In an alternate embodiment, the steps of patterning the select gate and dummy logic gate may be done in separate steps.

Figure 11:
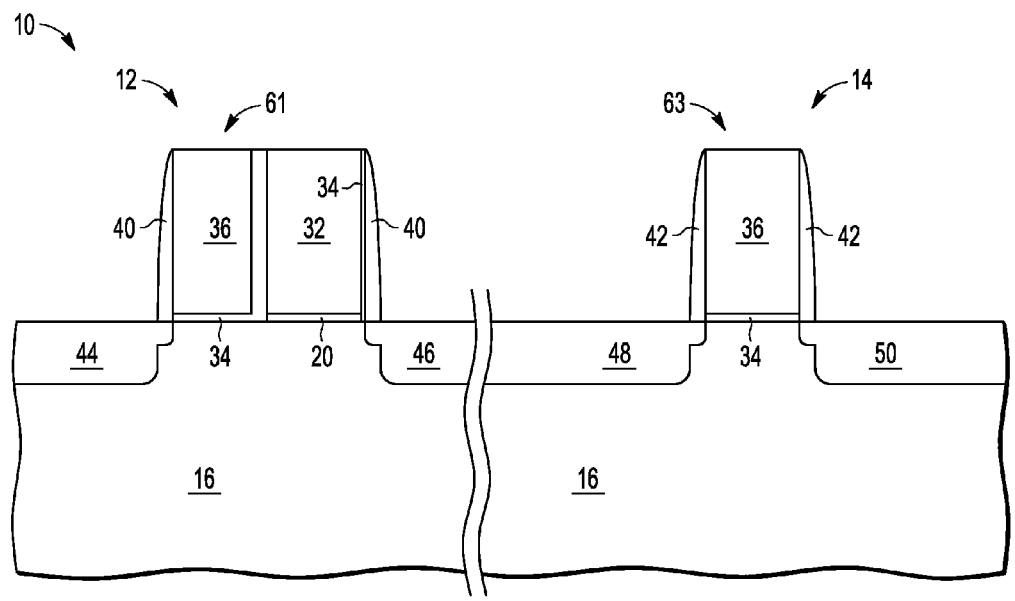
FIG. 11 is a cross section of the semiconductor device of FIG. 10 at a subsequent stage in processing.

Shown in FIG. 11 is semiconductor device 10 after forming sidewall spacers and performing implants in typical fashion for forming transistors resulting in a sidewall spacer 40 around the first portion of polysilicon layer 36 and control gate 32, a source/drain region 44 in substrate 16 substantially aligned to a first sidewall of select gate 61, a source/drain region 46 substantially aligned to the second sidewall of control gate 32, a sidewall spacer 42 around dummy gate 63, a source/drain region 48 substantially aligned to a first sidewall of dummy gate 63, and a source/drain region 50 substantially aligned to a second sidewall of dummy gate 63. Subsequent to the source/drain formation, the gates and source/drain regions may be silicided using conventional processing. Sidewall spacers 40 and 42 may additionally have a liner layer between the gate and the spacer. In an alternate embodiment, source/drain regions 44 and 46 may be formed separately from source/drain regions 48 and 50.

Figure 12:
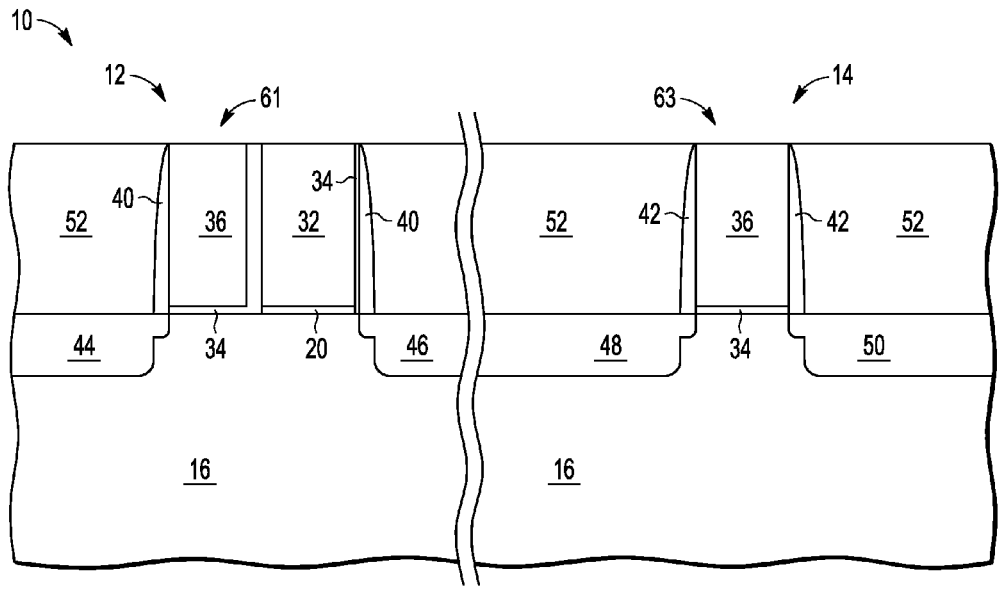
FIG. 12 is a cross section of the semiconductor device of FIG. 11 at a subsequent stage in processing.

Shown in FIG. 12 is semiconductor device 10 after forming an interlayer dielectric (ILD) 52 by deposition followed by CMP. FIG. 12 thus shows ILD 52 having portions around sidewall spacers 40 and 42. The CMP results select gate 61, control gate 32 and dummy gate 63 being exposed. The CMP removes the small gap region that may form between the top portions of select gate 61 and control gate 32 during formation of sidewall spacers 40 and 42.

Figure 13:
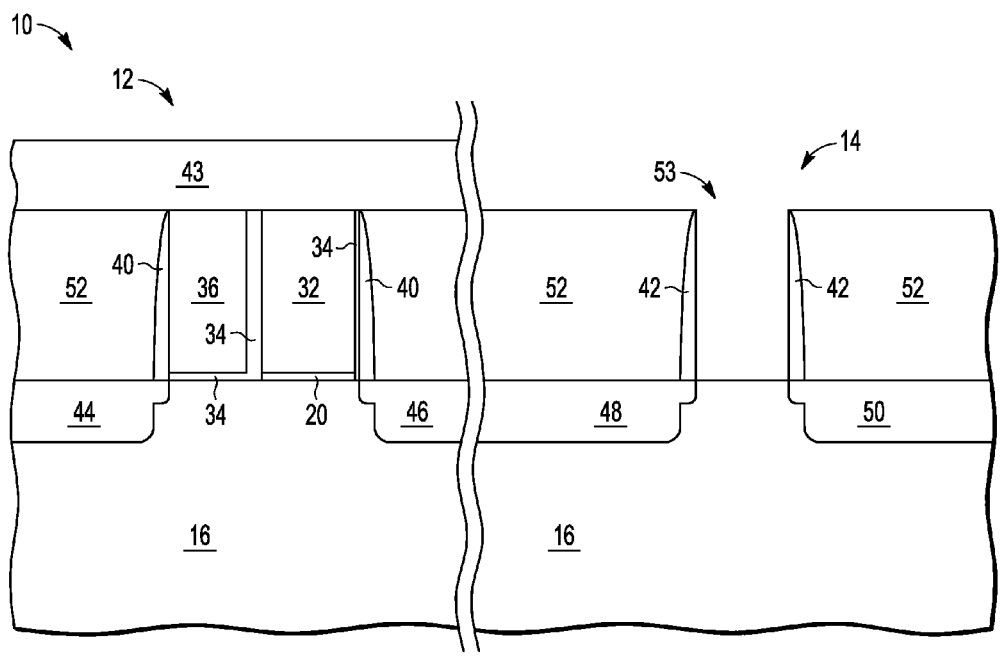
FIG. 13 is a cross section of the semiconductor device of FIG. 12 at a subsequent stage in processing.

Shown in FIG. 13 is semiconductor device 10 after forming a hard mask layer 43 over NVM portion 12 and then removing dummy gate 63. Hard mask layer 43 may comprise silicon nitride. The removal of dummy gate 63 may be achieved without a mask. Hard mask layer 43 may be formed by a blanket deposition followed by removing the portion of the blanket deposition over the logic region. After removing dummy gate 63, oxide layer 34 is removed from logic region 14 to form an opening 53 surrounded by sidewall spacer 42 and to expose substrate 16 for formation of a high-k dielectric for transistors to be formed in logic region 14.

Figure 14:
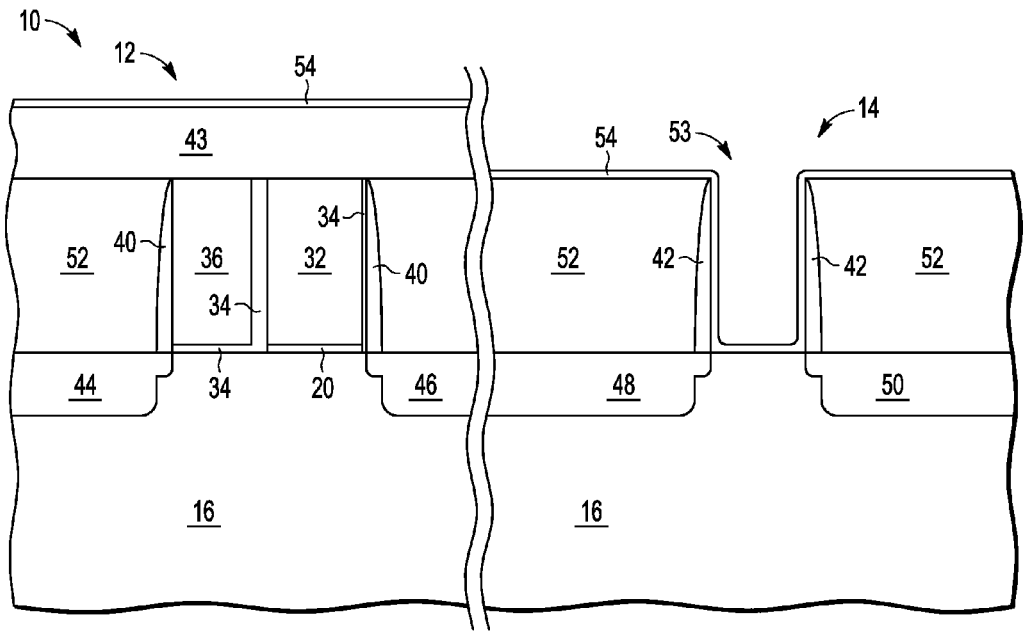
FIG. 14 is a cross section of the semiconductor device of FIG. 13 at a subsequent stage in processing.

Shown in FIG. 14 is semiconductor device 10 after forming a high-k dielectric 54 over NVM region 12 and logic region 14. High-k dielectric 54 is for use as a gate dielectric for a logic transistor to be formed in logic region 14. The portion of high-k dielectric 54 formed in logic region 14 includes being on substrate 16 inside sidewall spacer 42 and along sidewalls of sidewall spacer 42 as well as being over the top surface of ILD 52.

Figure 15:
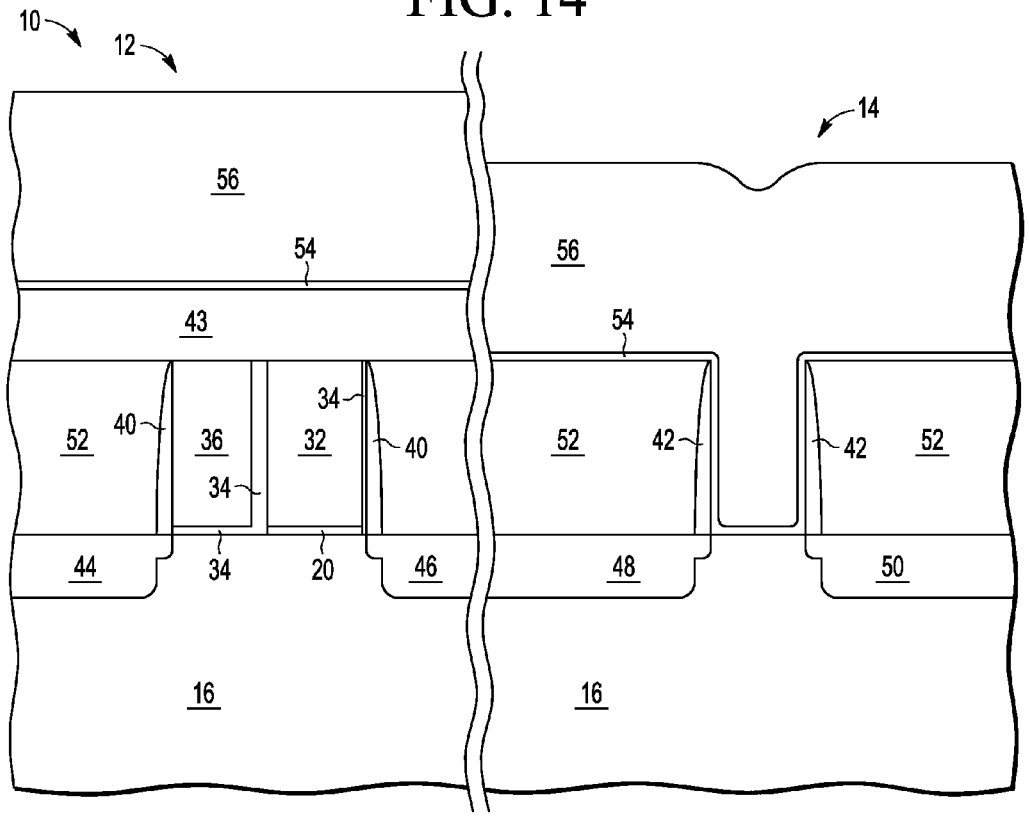
FIG. 15 is a cross section of the semiconductor device of FIG. 14 at a subsequent stage in processing.

Shown in FIG. 15 is semiconductor device 10 after forming a gate material 56 that fills the opening formed by removing dummy gate 63 as shown FIG. 13. Gate material 56 includes metal but may be a stack of different metals such as a work-function-setting metal directly on high-k dielectric 54 with a fill metal on the work-function-setting metal. There may also be a polysilicon layer as part of the stack.

Figure 16:
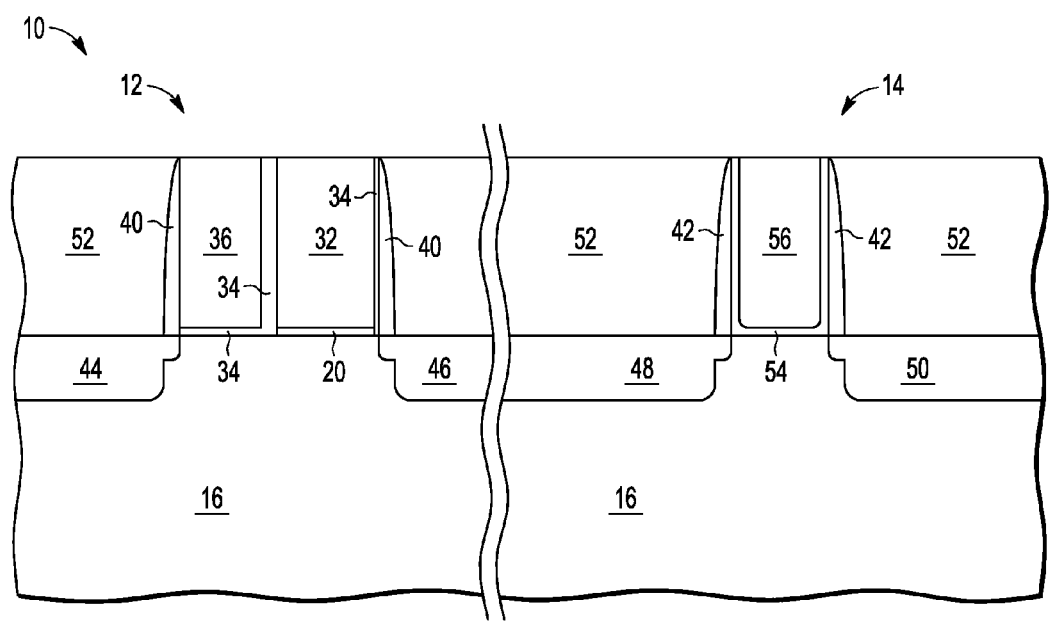
FIG. 16 is a cross section of the semiconductor device of FIG. 15 at a subsequent stage in processing.

Shown in FIG. 16 is semiconductor device 10 after performing CMP to remove hard mask 43, high-k dielectric layer 54 and gate material 56 in NVM region 12, and high-k dielectric layer 54 and gate material 56 on ILD 52 in logic region 14.

The result is the logic gate formed of gate material 56 in logic region 14 in opening 53 as shown in FIG. 13.

Thus an efficient manner of forming an NVM memory cell and a logic transistor is achieved in which the gate dielectrics can be thermally grown or high-k, the gates can be polysilicon or metal, and the storage layer can be polysilicon or metal nanocrystals, and in an alternative embodiment, the storage layer could be nitride.

By now it should be appreciated that there has been provided a method of making a logic transistor in a logic region of a substrate and a non-volatile memory (NVM) cell in an NVM region of the substrate. The method includes forming a control gate overlying a charge storage layer over the substrate in the NVM region. The method further includes forming a thermally-grown oxygen-containing dielectric layer over the substrate and the control gate in the NVM region and over the substrate in the logic region. The method further includes forming a polysilicon layer over the thermally-grown oxygen-containing dielectric layer in the NVM region and the logic region. The method further includes planarizing the polysilicon layer. The method further includes forming a first masking layer in the NVM region wherein the first masking layer defines a select gate location laterally adjacent the control gate in the NVM region. The method further includes forming a second masking layer in the logic region wherein the second masking layer defines a logic gate location in the logic region. The method further includes using the first masking layer to remove exposed portions of the polysilicon layer from the NVM region, wherein a first portion of the polysilicon layer remains at the select gate location to form a select gate. The method further includes using the second masking layer to remove exposed portions of the polysilicon layer from the logic region, wherein a second portion of the polysilicon layer remains at the logic gate location. The method further includes forming a dielectric layer in the NVM region and the logic region, wherein the dielectric layer is formed over the select gate, the control gate, and the second portion of the polysilicon layer. The method further includes planarizing the dielectric layer to expose the second portion of the polysilicon layer. The method further includes removing the second portion of the polysilicon layer and a portion of the thermally-grown oxygen-containing dielectric layer to result in an opening at the logic gate location which exposes the substrate. The method further includes forming a high-k gate dielectric layer and a logic gate within the opening in the logic region. The method may have a further characterization by which the step of forming the first masking layer is performed such that: the first masking layer is directly over the control gate, and a first edge of the first masking layer extends laterally from the control gate onto the polysilicon layer to define the select gate location laterally adjacent the control gate in the NVM region. The method may have a further characterization by which the first masking layer and the second masking layer are portions of a same patterned masking layer, and wherein the steps of using the first masking layer to remove exposed portions of the polysilicon layer from the NVM region and using the second masking layer to remove exposed portions of the polysilicon layer from the logic region are performed simultaneously. The method may further include, prior to the step of forming the thermally-grown oxygen-containing dielectric layer, forming an oxide spacer on a sidewall of the control gate. The method may have a further characterization by which, prior to the step of removing the second portion of the polysilicon layer and the portion of the thermally-grown oxygen-containing dielectric layer to result in the opening at the logic gate location, the method further includes forming a protection layer over the select gate and the control gate in the NVM region and over the second portion of the polysilicon layer in the logic region; and patterning the protection layer to remove portions of the protection layer from the logic region. The method may have a further characterization by which the step of forming the high-k gate dielectric and the logic gate includes forming the high-k gate dielectric layer over the protection layer in the NVM region and over the dielectric layer and within the opening in the logic region forming a gate layer over the high-k gate dielectric layer and the protection layer in the NVM region and over the high-k gate dielectric layer and within the opening in the logic region; and planarizing the gate layer such that the gate layer, the protection layer, and the high-k gate dielectric are removed from the NVM region. The method may have a further characterization by which top surfaces of the logic gate and the select gate are substantially coplanar. The method may have a further characterization by which after the steps of using the first and second masking layers to remove exposed portions of the polysilicon layer in the NVM region and the logic region, the method further includes forming a first source/drain region in the substrate laterally adjacent the select gate and a second source/drain region in the substrate laterally adjacent the control gate, such that the select gate and the control gate are located between the first and second source/drain regions; and forming a third source/drain region in the substrate laterally adjacent a first sidewall of the second portion of the polysilicon layer and a fourth source/drain region in the substrate laterally adjacent a second sidewall of the second portion of the polysilicon layer. The method may have a further characterization by which after the steps of using the first and second masking layers to remove exposed portions of the polysilicon layer in the NVM region and the logic region, the method further includes forming a first sidewall spacer surrounding outer sidewalls of the select gate and the control gate and a second sidewall spacer surrounding the second portion of the polysilicon layer. The method may have a further characterization by which the step of forming the control gate overlying the charge storage layer over the substrate in the NVM region includes forming the charge storage layer over the substrate in the NVM region and the logic region forming a second polysilicon layer over the charge storage layer in the NVM region and the logic region; and patterning the second polysilicon layer and the charge storage layer to form the control gate in the NVM region and to remove the second polysilicon layer and the charge storage layer from the logic region. The method may have a further characterization by which the charge storage layer comprises at least one of nanocrystals or a nitride. The method may have a further characterization by which the control gate includes polysilicon. The method may have a further characterization by which the logic gate includes a metal.

Also disclosed is a method of making a logic transistor in a logic region of a substrate and a non-volatile memory (NVM) cell in an NVM region of the substrate. The method includes forming a control gate overlying a charge storage layer over the substrate in the NVM region, wherein the control gate comprises polysilicon. The method further includes forming an oxide spacer on a sidewall of the control gate. The method further includes thermally growing an oxygen-containing layer on the substrate and on the control gate. The method further includes forming a polysilicon layer over the oxygen-containing layer in the NVM region and the logic region. The method further includes planarizing the polysilicon layer. The method further includes forming a patterned masking layer in the NVM region and the logic region, wherein the patterned masking layer comprises a first masking portion formed over the polysilicon layer and control gate in the NVM region and a second masking portion over the polysilicon layer in the logic region, wherein the first masking portion is directly over the control gate and a first edge of the first masking portion extends laterally from the control gate onto the polysilicon layer to define a select gate location laterally adjacent the control gate in the NVM region; and the second masking portion defines a logic gate location in the logic region. The method further includes using the patterned masking layer to remove exposed portions of the polysilicon layer, wherein a first portion of the polysilicon layer remains at the select gate location to form a select gate and a second portion of the polysilicon layer remains at the logic gate location. The method further includes forming a dielectric layer in the NVM region and the logic region, wherein the dielectric layer is formed over the select gate, the control gate, and the second portion of the polysilicon layer. The method further includes planarizing the dielectric layer to expose the second portion of the polysilicon layer. The method further includes forming a protection layer over the select gate and the control gate in the NVM region, wherein the protection layer exposes the logic region. The method further includes removing the second portion of the polysilicon layer and a portion of the oxygen-containing layer to result in an opening at the logic gate location. The method further includes forming a high-k gate dielectric layer over the protection layer in the NVM region and over the dielectric layer and within the opening in the logic region. The method further includes forming a logic gate in the logic region within the opening and over the high-k gate dielectric layer. The method may have a further characterization by which a thickness of the oxide spacer is in a range of 60 to 150 Angstroms. The method may have a further characterization by which the step of forming the logic gate includes forming a gate layer over the high-k gate dielectric layer and the protection layer in the NVM region and over the high-k gate dielectric layer and within the opening in the logic region; and planarizing the gate layer such that the gate layer, the protection layer, and the high-k gate dielectric layer are removed from the NVM region. The method may have a further characterization by which after the step of using the patterned masking layer to remove exposed portions of the polysilicon layer and prior to the step of forming the protection layer, the method further includes forming a first source/drain region in the substrate laterally adjacent the select gate and a second source/drain region in the substrate laterally adjacent the control gate, such that the select gate and the control gate are located between the first and second source/drain regions; forming a third source/drain region in the substrate laterally adjacent a first sidewall of the second portion of the polysilicon layer and a fourth source/drain region in the substrate laterally adjacent a second sidewall of the second portion of the polysilicon layer; and forming a first sidewall spacer surrounding outer sidewalls of the select gate and the control gate and a second sidewall spacer surrounding the second portion of the polysilicon layer.

Disclosed also is a method of making a logic transistor in a logic region of a substrate and a non-volatile memory (NVM) cell in an NVM region of the substrate. The method includes forming a nanocrystal stack layer over the substrate in the NVM region and the logic region. The method further includes forming a first polysilicon layer over the nanocrystal stack layer in the NVM region and the logic region. The method further includes patterning the first polysilicon layer and the nanocrystal stack layer to form a control gate in the NVM region and to remove the first polysilicon layer and the charge storage layer from the logic region. The method further includes forming a thermally-grown oxygen-containing dielectric layer over the substrate and the control gate in the NVM region and over the substrate in the logic region. The method further includes forming a second polysilicon layer over the oxygen-containing dielectric layer in the NVM region and the logic region. The method further includes planarizing the second polysilicon layer, wherein the oxygen-containing dielectric layer comprises a sidewall portion located along the sidewall of the control gate. The method further includes forming a patterned masking layer in the NVM region and the logic region, wherein the patterned masking layer comprises a first masking portion formed over the second polysilicon layer and the control gate in the NVM region and a second masking portion over the second polysilicon layer in the logic region, wherein: the first masking portion is directly over the control gate and a first edge of the first masking portion extends laterally from the control gate onto the second polysilicon layer to define a select gate location laterally adjacent the control gate in the NVM region; and the second masking portion defines a logic gate location in the logic region. The method further includes using the patterned masking layer to remove exposed portions of the second polysilicon layer, wherein a first portion of the second polysilicon layer remains at the select gate location to form a select gate and a second portion of the second polysilicon layer remains at the logic gate location. The method further includes forming a dielectric layer in the NVM region and the logic region, wherein the dielectric layer is formed over the select gate, the control gate, and the second portion of the second polysilicon layer. The method further includes planarizing the dielectric layer to expose the second portion of the second polysilicon layer. The method further includes forming a protection layer over the select gate and the control gate in the NVM region and over the second polysilicon layer in the logic region. The method further includes patterning the protection layer to remove portions of the protection layer from the logic region. The method further includes removing the second portion of the second polysilicon layer and a portion of the thermally-grown oxygen-containing dielectric layer to result in an opening at the logic gate location. The method further includes forming a high-k gate dielectric layer over the protection layer in the NVM region and over the dielectric layer and within the opening in the logic region. The method further includes forming a logic gate in the logic region within the opening and over the high-k gate dielectric layer. The method may have a further characterization by which the step of forming the logic gate includes forming a gate layer over the high-k gate dielectric layer and the protection layer in the NVM region and over the high-k gate dielectric layer and within the opening in the logic region; and planarizing the gate layer such that the gate layer, the protection layer, and the high-k gate dielectric layer are removed from the NVM region.

Disclosed also is a method of making a logic transistor in a logic region of a substrate and a non-volatile memory (NVM) cell in an NVM region of the substrate. The method includes forming a nanocrystal stack layer over the substrate in the NVM region and the logic region. The method further includes forming a first polysilicon layer over the nanocrystal stack layer in the NVM region and the logic region. The method further includes patterning the first polysilicon layer and the nanocrystal stack layer to form a control gate in the NVM region and to remove the first polysilicon layer and the charge storage layer from the logic region. The method further includes forming a thermally-grown oxygen-containing dielectric layer over the substrate and the control gate in the NVM region and over the substrate in the logic region. The method further includes forming a second polysilicon layer over the oxygen-containing dielectric layer in the NVM region and the logic region. The method further includes planarizing the second polysilicon layer, wherein the oxygen-containing dielectric layer comprises a sidewall portion located along the sidewall of the control gate. The method further includes forming a patterned masking layer in the NVM region and the logic region, wherein the patterned masking layer comprises a first masking portion formed over the second polysilicon layer and the control gate in the NVM region and a second masking portion over the second polysilicon layer in the logic region, wherein: the first masking portion is directly over the control gate and a first edge of the first masking portion extends laterally from the control gate onto the second polysilicon layer to define a select gate location laterally adjacent the control gate in the NVM region; and the second masking portion defines a logic gate location in the logic region. The method further includes using the patterned masking layer to remove exposed portions of the second polysilicon layer, wherein a first portion of the second polysilicon layer remains at the select gate location to form a select gate and a second portion of the second polysilicon layer remains at the logic gate location. The method further includes forming a dielectric layer in the NVM region and the logic region, wherein the dielectric layer is formed over the select gate, the control gate, and the second portion of the second polysilicon layer. The method further includes planarizing the dielectric layer to expose the second portion of the second polysilicon layer. The method further includes forming a protection layer over the select gate and the control gate in the NVM region and over the second polysilicon layer in the logic region. The method further includes patterning the protection layer to remove portions of the protection layer from the logic region. The method further includes removing the second portion of the second polysilicon layer and a portion of the thermally-grown oxygen-containing dielectric layer to result in an opening at the logic gate location. The method further includes forming a high-k gate dielectric layer over the protection layer in the NVM region and over the dielectric layer and within the opening in the logic region. The method further includes forming a logic gate in the logic region within the opening and over the high-k gate dielectric layer. The method may have a further characterization by which the step of forming the logic gate includes forming a gate layer over the high-k gate dielectric layer and the protection layer in the NVM region and over the high-k gate dielectric layer and within the opening in the logic region; and planarizing the gate layer such that the gate layer, the protection layer, and the high-k gate dielectric layer are removed from the NVM region.

Although the invention is described herein with reference to specific embodiments, various modifications and changes can be made without departing from the scope of the present invention as set forth in the claims below. For example, the various dimensions may be different than those described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a logic transistor in a logic region of a substrate and a non-volatile memory (NVM) cell in an NVM region of the substrate, comprising:
    forming a control gate overlying a charge storage layer over the substrate in the NVM region;
    forming a thermally-grown oxygen-containing dielectric layer over the substrate and the control gate in the NVM region and over the substrate in the logic region;
    forming a polysilicon layer over the thermally-grown oxygen-containing dielectric layer in the NVM region and the logic region;
    planarizing the polysilicon layer;
    forming a first masking layer in the NVM region wherein the first masking layer defines a select gate location laterally adjacent the control gate in the NVM region;
    forming a second masking layer in the logic region wherein the second masking layer defines a logic gate location in the logic region;
    using the first masking layer to remove exposed portions of the polysilicon layer from the NVM region, wherein a first portion of the polysilicon layer remains at the select gate location to form a select gate;
    using the second masking layer to remove exposed portions of the polysilicon layer from the logic region, wherein a second portion of the polysilicon layer remains at the logic gate location;
    forming a dielectric layer in the NVM region and the logic region, wherein the dielectric layer is formed over the select gate, the control gate, and the second portion of the polysilicon layer;
    planarizing the dielectric layer to expose the second portion of the polysilicon layer;
    removing the second portion of the polysilicon layer and a portion of the thermally-grown oxygen-containing dielectric layer to result in an opening at the logic gate location which exposes the substrate; and
    forming a high-k gate dielectric layer and a logic gate within the opening in the logic region.

2. The method of claim 1, wherein the step of forming the first masking layer is performed such that:
    the first masking layer is directly over the control gate, and
    a first edge of the first masking layer extends laterally from the control gate onto the polysilicon layer to define the select gate location laterally adjacent the control gate in the NVM region.

3. The method of claim 1, wherein the first masking layer and the second masking layer are portions of a same patterned masking layer, and wherein the steps of using the first masking layer to remove exposed portions of the polysilicon layer from the NVM region and using the second masking layer to remove exposed portions of the polysilicon layer from the logic region are performed simultaneously.

4. The method of claim 1, further comprising:
    prior to the step of forming the thermally-grown oxygen-containing dielectric layer, forming an oxide spacer on a sidewall of the control gate.

5. The method of claim 4, wherein a thickness of the oxide spacer is in a range of 60 to 150 Angstroms.

6. The method of claim 1, wherein prior to the step of removing the second portion of the polysilicon layer and the portion of the thermally-grown oxygen-containing dielectric layer to result in the opening at the logic gate location, the method further comprises:
   forming a protection layer over the select gate and the control gate in the NVM region and over the second portion of the polysilicon layer in the logic region; and
   patterning the protection layer to remove portions of the protection layer from the logic region.

7. The method of claim 6, wherein the step of forming the high-k gate dielectric and the logic gate comprises:
   forming the high-k gate dielectric layer over the protection layer in the NVM region and over the dielectric layer and within the opening in the logic region;
   forming a gate layer over the high-k gate dielectric layer and the protection layer in the NVM region and over the high-k gate dielectric layer and within the opening in the logic region; and
   planarizing the gate layer such that the gate layer, the protection layer, and the high-k gate dielectric are removed from the NVM region.

8. The method of claim 1, wherein top surfaces of the logic gate and the select gate are substantially coplanar.

9. The method of claim 1, wherein after the steps of using the first and second masking layers to remove exposed portions of the polysilicon layer in the NVM region and the logic region, the method further comprises:
   forming a first source/drain region in the substrate laterally adjacent the select gate and a second source/drain region in the substrate laterally adjacent the control gate, such that the select gate and the control gate are located between the first and second source/drain regions; and
   forming a third source/drain region in the substrate laterally adjacent a first sidewall of the second portion of the polysilicon layer and a fourth source/drain region in the substrate laterally adjacent a second sidewall of the second portion of the polysilicon layer.

10. The method of claim 9, wherein after the steps of using the first and second masking layers to remove exposed portions of the polysilicon layer in the NVM region and the logic region, the method further comprises:
   forming a first sidewall spacer surrounding outer sidewalls of the select gate and the control gate and a second sidewall spacer surrounding the second portion of the polysilicon layer.

11. The method of claim 1, wherein the step of forming the control gate overlying the charge storage layer over the substrate in the NVM region comprises:
   forming the charge storage layer over the substrate in the NVM region and the logic region;
   forming a second polysilicon layer over the charge storage layer in the NVM region and the logic region; and
   patterning the second polysilicon layer and the charge storage layer to form the control gate in the NVM region and to remove the second polysilicon layer and the charge storage layer from the logic region.

12. The method of claim 1, wherein the charge storage layer comprises at least one of nanocrystals or a nitride.

13. The method of claim 12, wherein the control gate comprises polysilicon.

14. The method of claim 1, wherein the logic gate comprises a metal.

15. A method of making a logic transistor in a logic region of a substrate and a non-volatile memory (NVM) cell in an NVM region of the substrate, comprising:
   forming a control gate overlying a charge storage layer over the substrate in the NVM region, wherein the control gate comprises polysilicon;
   forming an oxide spacer on a sidewall of the control gate;
   thermally growing an oxygen-containing layer on the substrate and on the control gate;
   forming a polysilicon layer over the oxygen-containing layer in the NVM region and the logic region;
   planarizing the polysilicon layer;
   forming a patterned masking layer in the NVM region and the logic region, wherein the patterned masking layer comprises a first masking portion formed over the polysilicon layer and control gate in the NVM region and a second masking portion over the polysilicon layer in the logic region, wherein:
      the first masking portion is directly over the control gate and a first edge of the first masking portion extends laterally from the control gate onto the polysilicon layer to define a select gate location laterally adjacent the control gate in the NVM region; and
      the second masking portion defines a logic gate location in the logic region;
   using the patterned masking layer to remove exposed portions of the polysilicon layer, wherein a first portion of the polysilicon layer remains at the select gate location to form a select gate and a second portion of the polysilicon layer remains at the logic gate location;
   forming a dielectric layer in the NVM region and the logic region, wherein the dielectric layer is formed over the select gate, the control gate, and the second portion of the polysilicon layer;
   planarizing the dielectric layer to expose the second portion of the polysilicon layer;
   forming a protection layer over the select gate and the control gate in the NVM region, wherein the protection layer exposes the logic region;
   removing the second portion of the polysilicon layer and a portion of the oxygen-containing layer to result in an opening at the logic gate location;
   forming a high-k gate dielectric layer over the protection layer in the NVM region and over the dielectric layer and within the opening in the logic region; and
   forming a logic gate in the logic region within the opening and over the high-k gate dielectric layer.

16. The method of claim 15, wherein a thickness of the oxide spacer is in a range of 60 to 150 Angstroms.

17. The method of claim 15, wherein the step of forming the logic gate comprises:
   forming a gate layer over the high-k gate dielectric layer and the protection layer in the NVM region and over the high-k gate dielectric layer and within the opening in the logic region; and
   planarizing the gate layer such that the gate layer, the protection layer, and the high-k gate dielectric layer are removed from the NVM region.

18. The method of claim 15, wherein after the step of using the patterned masking layer to remove exposed portions of the polysilicon layer and prior to the step of forming the protection layer, the method further comprises:
   forming a first source/drain region in the substrate laterally adjacent the select gate and a second source/drain region in the substrate laterally adjacent the control gate, such that the select gate and the control gate are located between the first and second source/drain regions;
   forming a third source/drain region in the substrate laterally adjacent a first sidewall of the second portion of the polysilicon layer and a fourth source/drain region in the substrate laterally adjacent a second sidewall of the second portion of the polysilicon layer; and forming a first sidewall spacer surrounding outer sidewalls of the select gate and the control gate and a second sidewall spacer surrounding the second portion of the polysilicon layer.

19. A method of making a logic transistor in a logic region of a substrate and a non-volatile memory (NVM) cell in an NVM region of the substrate, comprising:

forming a nanocrystal stack layer over the substrate in the NVM region and the logic region;

forming a first polysilicon layer over the nanocrystal stack layer in the NVM region and the logic region;

patterning the first polysilicon layer and the nanocrystal stack layer to form a control gate in the NVM region and to remove the first polysilicon layer and the charge storage layer from the logic region;

forming a thermally-grown oxygen-containing dielectric layer over the substrate and the control gate in the NVM region and over the substrate in the logic region; forming a second polysilicon layer over the oxygen-containing dielectric layer in the NVM region and the logic region;

planarizing the second polysilicon layer, wherein the oxygen-containing dielectric layer comprises a sidewall portion located along the sidewall of the control gate;

forming a patterned masking layer in the NVM region and the logic region, wherein the patterned masking layer comprises a first masking portion formed over the second polysilicon layer and the control gate in the NVM region and a second masking portion over the second polysilicon layer in the logic region, wherein:

the first masking portion is directly over the control gate and a first edge of the first masking portion extends laterally from the control gate onto the second polysilicon layer to define a select gate location laterally adjacent the control gate in the NVM region; and the second masking portion defines a logic gate location in the logic region;

using the patterned masking layer to remove exposed portions of the second polysilicon layer, wherein a first portion of the second polysilicon layer remains at the select gate location to form a select gate and a second portion of the second polysilicon layer remains at the logic gate location;

forming a dielectric layer in the NVM region and the logic region, wherein the dielectric layer is formed over the select gate, the control gate, and the second portion of the second polysilicon layer;

planarizing the dielectric layer to expose the second portion of the second polysilicon layer;

forming a protection layer over the select gate and the control gate in the NVM region and over the second polysilicon layer in the logic region;

patterning the protection layer to remove portions of the protection layer from the logic region;

removing the second portion of the second polysilicon layer and a portion of the thermally-grown oxygen-containing dielectric layer to result in an opening at the logic gate location;

forming a high-k gate dielectric layer over the protection layer in the NVM region and over the dielectric layer and within the opening in the logic region; and forming a logic gate in the logic region within the opening and over the high-k gate dielectric layer.

20. The method of claim 19, wherein the step of forming the logic gate comprises:

forming a gate layer over the high-k gate dielectric layer and the protection layer in the NVM region and over the high-k gate dielectric layer and within the opening in the logic region; and planarizing the gate layer such that the gate layer, the protection layer, and the high-k gate dielectric layer are removed from the NVM region.

\* \* \* \* \*